US007679370B2

(12) United States Patent
Nair

(10) Patent No.: US 7,679,370 B2
(45) Date of Patent: Mar. 16, 2010

(54) CONTROLLER HAVING DISCRETE DRIVER CIRCUITRY CONNECTED TO A SINGLE PROCESSOR PORT

(75) Inventor: Balakrishnan V. Nair, Singapore (SG)

(73) Assignee: Delphi Technologies, Inc., Troy, MI (US)

( * ) Notice: Subject to any disclaimer, the term of this patent is extended or adjusted under 35 U.S.C. 154(b) by 309 days.

(21) Appl. No.: 11/704,667

(22) Filed: Feb. 9, 2007

(65) Prior Publication Data
US 2008/0195873 A1 Aug. 14, 2008

(51) Int. Cl.
G01R 31/02 (2006.01)
H04L 1/14 (2006.01)
(52) U.S. Cl. .................. 324/509; 361/93.2; 714/750
(58) Field of Classification Search .......... 324/509; 361/93.2; 714/750
See application file for complete search history.

(56) References Cited

U.S. PATENT DOCUMENTS

| | | | | |
|---|---|---|---|---|
| 4,216,756 A | * | 8/1980 | Mura | 123/597 |
| 4,612,638 A | * | 9/1986 | Kissel | 714/25 |
| 5,510,950 A | * | 4/1996 | Bills et al. | 361/93.2 |
| 5,672,917 A | * | 9/1997 | Nakano | 307/116 |
| 5,757,601 A | | 5/1998 | Macks | |
| 5,920,452 A | * | 7/1999 | Sullivan | 361/101 |
| 6,246,559 B1 | * | 6/2001 | Sanders et al. | 361/93.1 |
| 2008/0138689 A1 | * | 6/2008 | Leo et al. | 429/34 |

FOREIGN PATENT DOCUMENTS

| | | |
|---|---|---|
| DE | 19522156 | 8/1996 |
| DE | 10211099 | 10/2003 |
| DE | 102005048801 | 4/2007 |
| EP | 0163845 | 12/1985 |
| EP | 0709961 | 5/1996 |

OTHER PUBLICATIONS

European Search Report dated Jul. 9, 2009.
Cordonnier C E: "Use of the Same MCU I/O Line to Drive a Power MOSFET and to Detect Overload", Motorola Technical Developments, Motorola Inc. Schaumburg, Illinois, US. vol. 16, Aug. 1, 1992, pp. 85-86, XP000310368, ISSN: 0887-5286.

* cited by examiner

*Primary Examiner*—Timothy J Dole
*Assistant Examiner*—John Zhu
(74) *Attorney, Agent, or Firm*—Jimmy L. Funke

(57) ABSTRACT

A controller having discrete driver circuitry for driving an electrical load and a method are provided. The controller includes a microprocessor having ports configurable to operate as inputs or outputs. The controller also includes discrete driver circuitry connected to ports of the microprocessor. The discrete driver circuitry is configured to apply electrical power to drive an electrical load. The controller further has logic for configuring the ports of the microprocessor as an output to enable on/off of the output signal that drives the electrical loads, and further for configuring the ports of the microprocessor as an input to receive feedback signals from the discrete driver circuitry. The feedback signals are processed to detect fault conditions.

12 Claims, 4 Drawing Sheets

CONTROLLER HAVING DISCRETE DRIVER CIRCUITRY CONNECTED TO A SINGLE PROCESSOR PORT

TECHNICAL FIELD

The present invention generally relates to a processor-based controller and, more particularly, relates to a controller for driving one or more electrical loads with discrete driver circuitry.

BACKGROUND OF THE INVENTION

Controllers are widely employed on board vehicles for controlling vehicle systems that typically employ electrical powered loads. Examples of electrical powered loads include solenoids, relays and other various electrically powered devices. In a vehicle application, the controller may be an engine controller. Typically, the controller includes a microprocessor for executing routines stored in memory according to predetermined control logic. In order to drive a given load, the controller typically employs drive circuitry which, responsive to a microprocessor output signal, applies electrical power (i.e. voltage and current) to the load. The microprocessor is typically configured to drive multiple loads via multiple discrete driver circuits.

The conventional driver circuitry is discrete driver circuitry that may be configured in various circuit arrangements, depending upon the load and its intended application. The conventional discrete driver circuitry generally includes an input coupled to a first port of the microprocessor which is configured as an output. Additionally, the conventional discrete driver circuitry has an output coupled to a second port of the microprocessor which is configured as an input. The first port of the microprocessor outputs a control signal, which typically is high (1) for driving the load and a low (0) for turning the load off. The second port of the microprocessor is configured as an input to receive feedback signals from the discrete driver circuitry. The feedback signals are typically processed to determine whether or not a fault condition is present at the load side. Typical faults that are monitored through the feedback signals are (1) short to battery fault (2) short to ground fault and (3) open wiring harness fault at the load side.

In automotive applications, to provide a cost-effective controller, discrete driver circuits have been used for high side and low side driver applications to meet extra demand in output. The current strategy of using the discrete driver circuits for output drivers in the automotive application may result in some drawbacks. For example, the discrete driver circuit is typically required to be coupled to two microprocessor discrete input/output ports. Additionally, the conventional discrete driver circuit usually uses a large number of discrete components which adds to the overall cost and consumes volume on the circuit board. Further, the typical discrete driver circuit arrangement compromises the fault diagnostics in that most of the discrete solution does not offer full diagnostic capabilities that detect both open circuit and short circuit faults. The large number of components in the discrete driver circuitry reduces the reliability generally due to the higher component count and increases the labor and parts cost.

It is therefore desirable to provide for a controller that utilizes discrete circuitry to drive a load in a manner that is affordable and consumes less space on the circuit board. It is further desirable to provide for such a controller that requires fewer ports of the microprocessor to drive a load and effectively detects fault conditions including open circuit and short circuit fault conditions.

SUMMARY OF THE INVENTION

In accordance with the teachings of the present invention, a controller having discrete driver circuitry for driving an electrical load and a method are provided. According to one aspect of the present invention, the controller includes a processor having at least one port configurable to operate as an input or an output. The controller also includes discrete driver circuitry connected to the one port of the processor. The discrete driver circuitry is configured to apply electrical power to drive an electrical load. The controller further has logic for configuring the one port of the processor as an output to provide an output signal that drives the electrical load, and further for configuring the same port of the processor as an input to receive a feedback signal from the driver circuitry.

According to another aspect of the present invention, a method of driving an electrical load and detecting a fault condition with discrete driver circuitry and a processor is provided. The method includes the steps of providing an electrical load coupled to discrete driver circuitry which is coupled to a single port of a processor, configuring the single output of the processor to operate as an output, outputting a signal at the single port of the processor signaling for the electrical load to be driven, and applying power to the electrical load responsive to the output signal. The method further includes the steps of configuring the single output of the processor to operate as an input, receiving a feedback signal from the discrete driver circuitry at the port of the processor, and detecting presence of a fault condition based on the feedback signal.

The controller and method of the present invention advantageously allows discrete driver circuitry to drive a load while requiring connection to only a single port of a processor that handles the control signal for driving the load and the feedback signal for fault detection. The system is cost affordable, uses reduced part components and is reliable. Additionally, the system and method advantageously detect open circuit and short circuit fault conditions by processing the feedback signal.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
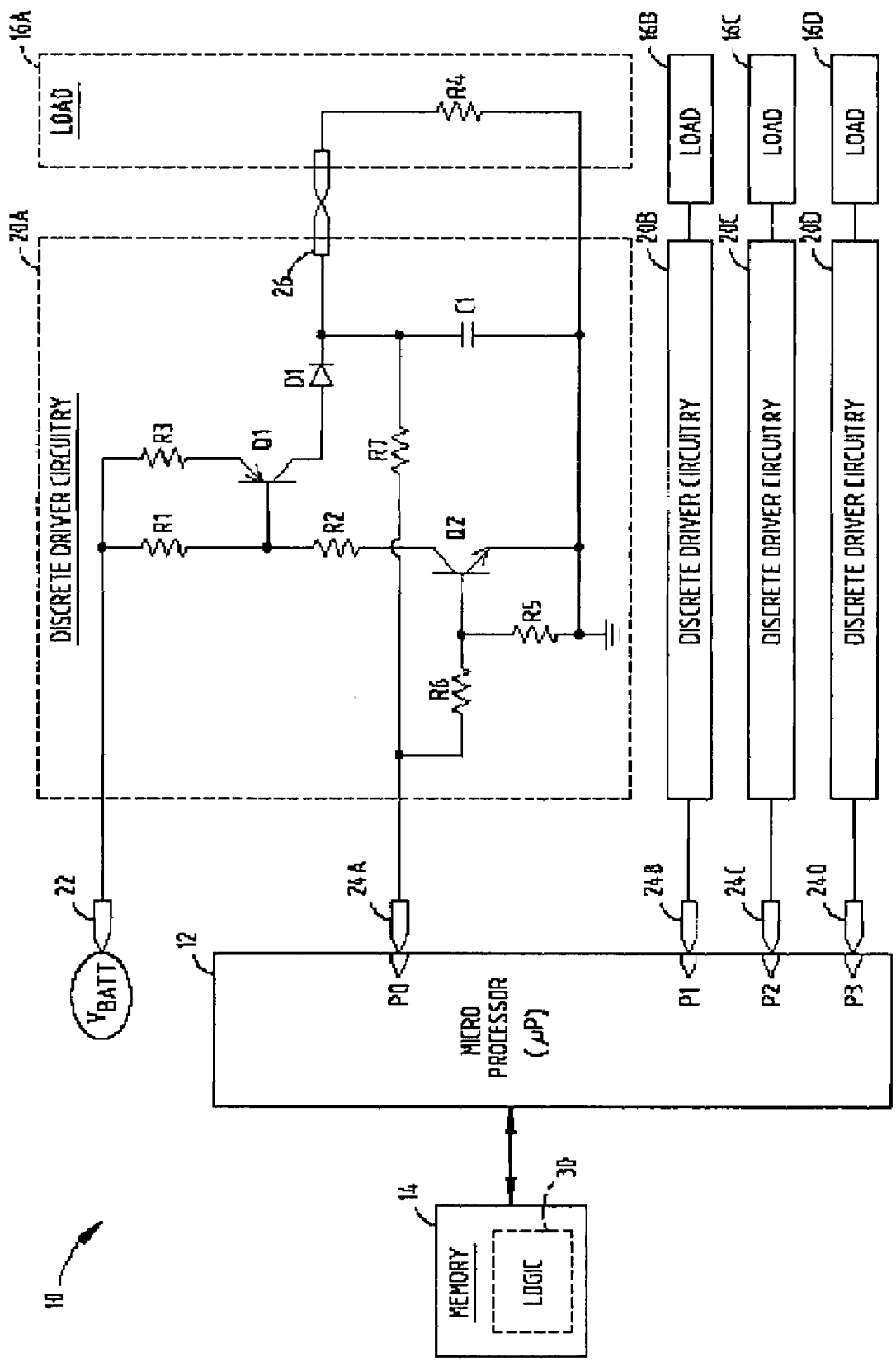
FIG. 1 is a block/circuit diagram illustrating a controller employing a microprocessor and discrete driver circuitry coupled to loads according to one embodiment of the present invention.

Referring now to FIG. 1, a controller 10 is generally illustrated employing a microprocessor 12, and discrete driver circuitry 20A-20D for driving respective electrical powered loads 16A-16D. The controller 10 may be configured to control any of a number of electrical loads for a given application. According to one embodiment, the controller 10 is employed on board a vehicle to control electrical loads relating to operation of the vehicle. According to one example, the controller 10 may be configured to control electrical loads associated with the vehicle power train. For example, the loads 16A-16D may include solenoids, relays, transistors or other electrically driven devices that are powered by electrical current.

The controller 10 includes a processor, in the form of a microprocessor 12, having a plurality of ports P0-P3. The microprocessor ports P0-P3 may each be configured to operate as an input or an output, depending upon how the microprocessor is configured by logic. That is, the microprocessor ports P0-P3 may be configured to operate as an output to output a control signal in an output mode or may be configured to operate as an input to receive an input signal in an input mode. One example of a microprocessor includes Model No. TC 1765, commercially available from Infineon.

The microprocessor 12 is coupled to and communicates with memory 14. Memory 14 may include random access memory (RAM), read-only memory (ROM), electronically erasable programmable read only memory (EEPROM), firmware, or other known memory as should be evident to those in the art. Stored within memory 14 is logic 30. Logic 30 is configured as software, according to one embodiment. Logic 30 includes a routine for configuring one or more of the microprocessor ports P0-P3 as either an input or an output. Logic 30 also includes a control routine for generating control signals to turn on and off each of loads 16A-16D. Logic 30 further processes input signals generally in the form of one or more feedback signals to determine if a fault condition exists.

The controller 10 includes discrete driver circuitry 20A-20D coupled to respective microprocessor ports P0-P3 by way of electrical connectors 24A-24D, respectively. Discrete driver circuitry 20A is connected to a single port P0 of microprocessor 12 via connector 24A for receiving control signals when port P0 is configured as an output, and for inputting feedback signals to port P0 when port P0 is configured as an input. Discrete driver circuitry 20A powers electrical load 16A responsive to a high (binary 1) control signal output at port P0 and turns off power to load 16A with a low control signal (binary 0) at port P0. Likewise, discrete driver circuitry 20B-20D are coupled to a single microprocessor ports P1-P3, respectively, to power respective electrical loads 16B-16D and receive feedback signals.

The discrete driver circuitry 20A further includes a power supply input connector 22 which is connected to a power supply referenced $V_{BATT}$. $V_{BATT}$ may include the battery voltage generally available from the ignition line on a vehicle, according to an exemplary embodiment. It should be appreciated that each of the discrete driver circuits 20B-20D likewise receives a power supply voltage, such as $V_{BATT}$, and includes similar circuitry for powering the respective electrical loads 16B-16D.

The discrete driver circuitry 20A is shown having resistors R1 and R2 coupled to battery input 22. Resistors R1 and R2 form a resistor divider network having a node therebetween coupled to the base of transistor Q1. When transistor Q1 is turned on, battery voltage $V_{BATT}$ is applied to diode D1 and to the high side driver (HSD) output 26. The high side driver output 26 is connected to the load 16A to apply the desired voltage across load 16 having resistance R4 which results in current flow.

The discrete driver circuitry 20A has electrical connector 24A coupled to microprocessor port P0. Connector 24A is coupled to resistors R6 and R7 which operate as a latch following receipt of a high output signal (e.g., binary 1) output from microprocessor port P0. Resistor R6 is further coupled to the base of transistor Q2 and to resistor R5 which is coupled to ground at the low side. A capacitor C1 is coupled across the high side at connector 26 and the low side at ground and in parallel with the electrical load 16A, which is shown having resistance R4.

In operation, the discrete driver circuitry 20A receives a battery voltage $V_{BATT}$ at battery input 22. With the microprocessor 12 configured with port P0 in the output mode, a high output signal of "1" output from port P0 causes electrical current to drive the electrical load 16A. This occurs because transistors Q2 and Q1 are turned on and resistors R6 and R7 latch to keep electrical power supplied to the load 16A. When a low output "0" is output at the microprocessor port P0, transistor Q2 is turned off, which turns off transistor Q1 and turns off electrical current supplied to the high side of the electrical load 16A.

The microprocessor 12 is configurable via logic 30 to cause ports P0 to P3 to operate as either output ports or input ports. When port P0 is reconfigured as an input, the microprocessor 12 receives feedback signals from the discrete driver circuitry 20A and processes the feedback signals to determine the presence of a fault condition, including detection of a short to ground, a short to battery, or an open circuit condition. The logic 30 for reconfiguring the microprocessor ports P0-P3 as inputs or outputs, for outputting control signals to power the electrical loads 16A-16D, and for detecting fault conditions via feedback signals is stored in memory 14 and executed by microprocessor 12, according to the exemplary embodiment.

When the microprocessor port P0 is reconfigured as an input, the microprocessor 12 compares the input signal with respect to the commanded output condition to determine whether the circuit is functioning normally or a fault condition is present. If low output signal is zero (0) is output from the microprocessor port P0 and the input feedback signal reads one (1), then a short to battery fault condition is detected. If a high output signal one (1) is supplied as an output to microprocessor port P0 and the input feedback signal is a high signal one (1), then the discrete driver circuitry 20A is determined to be operating in the normal condition. If a low signal of zero is received as the input feedback signal, then the microprocessor detects if the output is experiencing a short to ground fault condition.

Open fault is detected when the load is switched off. In order to switch off the load 16A, the microprocessor 12 turns off the output configured port P0 by writing a low signal of "0" to the output port P0. Transistor Q2 is turned off so transistor Q1 is off. Capacitor C1 holds an electrical charge which is useful to detect an open circuit fault condition due to the resulting slow discharge of capacitor C1, which is indicative of an open fault condition. According to one example with a load having an expected resistance R4 equal to about 50 ohms, resistors R5 and R6 are each equal to 10 kilo ohm, while resistor R7 is equal to about 50 kilo ohm. Because the capacitor C1 will not be discharged quickly if the output of the load 16A is open circuited, it takes longer to discharge through resistor R7. Resistor R7 and capacitor C1 values are adjusted in such a way that the capacitor discharges slowly when the output is open. For normal operation, the capacitor C1 will discharge faster through the load resistor R4 to the grounded low side. If the load is open circuited, the microprocessor port reads a logic "1" as the feedback signal due to slow discharge of the capacitor C1. For proper discharge of capacitor C1 during normal operation, for a time duration such as 300 microseconds the port is written with "0" value before the port is configured as input for reading the feedback signal.

Figure 2A:
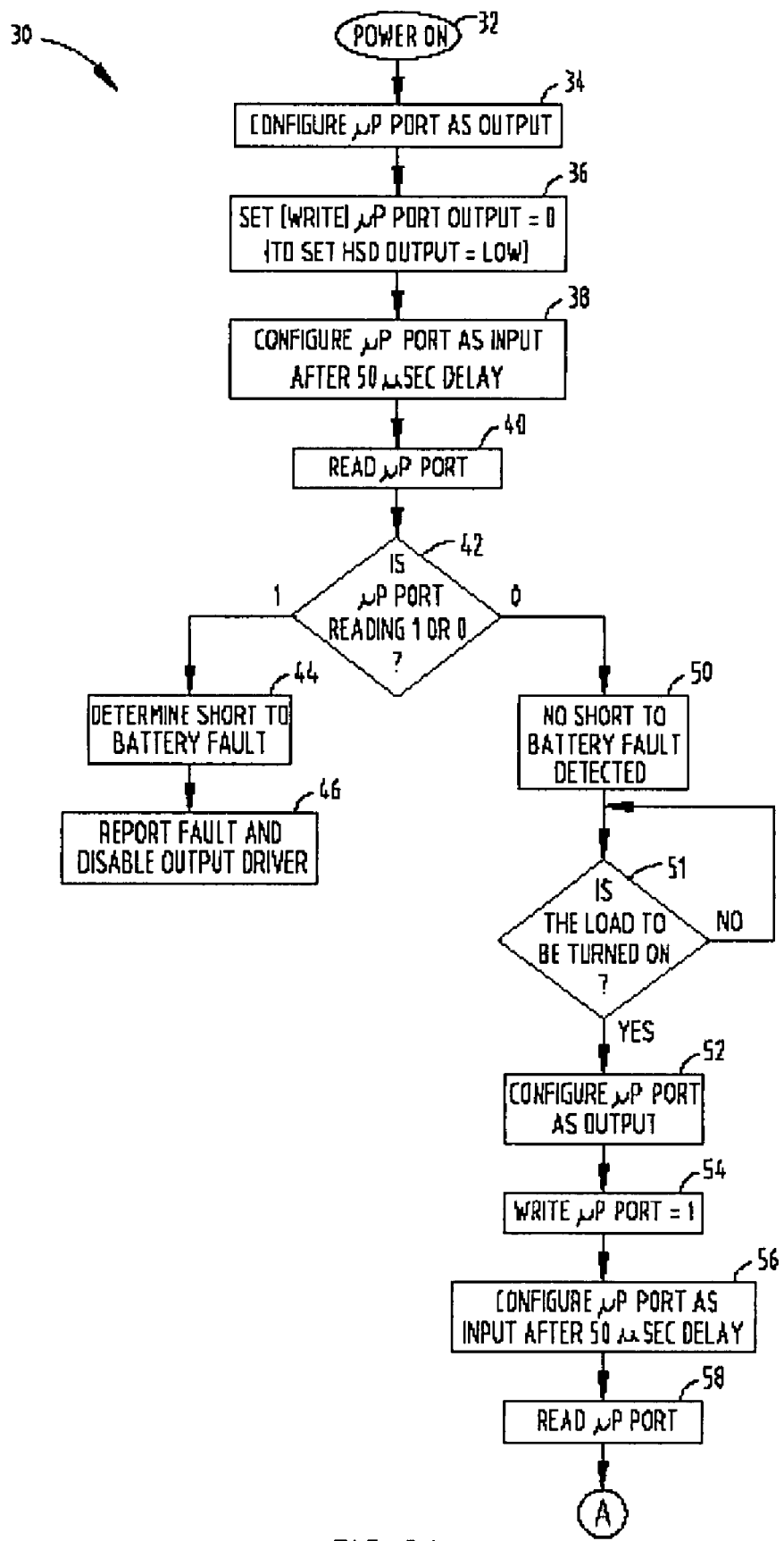
FIGS. 2A-2B is a flow diagram illustrating a routine for driving a load with the controller shown in FIG. 1.
Figure 2B:
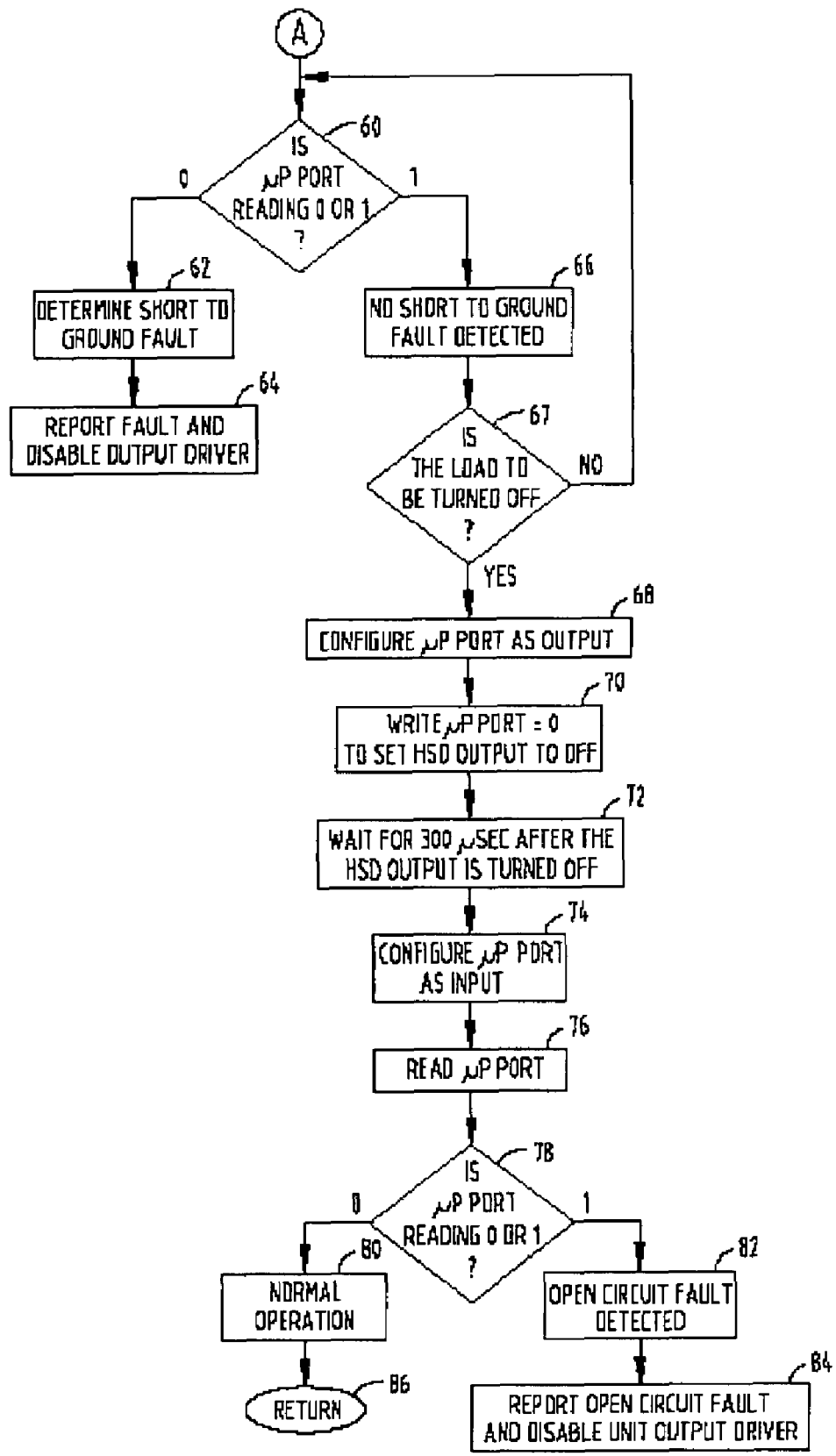

Referring to FIGS. 2A-2B, the logic 30 is shown as a software routine performing steps 32-86, according to one embodiment. The logic 30 may be implemented as one or more software routines stored in memory 14 and executed by microprocessor 12. Following the initial power on in step 32, routine 30 proceeds to configured the microprocessor port as an output in step 34. Routine 30 then sets (writes) the microprocessor port output equal to zero (0) to set the high side driver output to low in step 36. Steps 34 and 36 may be implemented during initialization.

Before the microprocessor output is switched on, the microprocessor will check for a short to battery fault condition at the load connector side. To check for a short to battery fault condition, the routine 30 will configure the microprocessor port as an input following a time delay of about 50 microseconds in step 38, and routine 30 will then read the input feedback signal at the microprocessor port in step 40. In decision step 42, routine 30 determines if the input feedback signal is a zero (0) or a one (1). If the input feedback signal at the microprocessor port is a one (1), routine 30 determines that there is a short to battery fault condition detected in step 44, and then proceeds to report the fault condition and disable that output driver (e.g., drive circuit and load coupled to the corresponding port) in step 46. If the input feedback signal at the microprocessor port is equal to zero (0), routine 30 determines in step 50 that there is no short to battery fault condition detected.

If there is no short to battery fault condition detected and if the load is to be turned on, as determined in decision step 51, then routine 30 proceeds to configure the microprocessor port as an output in step 52. Next, routine 30 writes a high signal of one as the output of the microprocessor port to turn the high side driver (HSD) output on in step 54. With the microprocessor configured as an output, the microprocessor may output a signal as logic one to drive a load via the discrete driver circuitry.

Next, the routine 30 will check for a short to ground fault condition. This may be achieved by configuring the microprocessor port as an input following a time delay of about 50 microseconds in step 56 and then reading the input feedback signal received at the microprocessor port in step 58. In step 60, routine 30 determines if the input feedback signal is set equal to zero (0) or one (1). If the input feedback signal received at the microprocessor port is determined to be set equal to zero, routine 30 determines in step 62 that a short to ground fault condition has been detected, and reports the fault condition and disables the output driver in step 64. If the input feedback signal received at the microprocessor port is determined to be equal to one, routine 30 determines in step 66 that there is no short to ground fault condition detected such that the discrete driver circuitry and load may be operable in normal operation.

Following the no short to ground fault detection in step 66, routine 30 proceeds to determine if the load is to be turned off in decision step 67 and, if not, returns to step 60. If the load is to be turned off, routine 30 configures the microprocessor port as an output in step 68. Next, routine 30 writes a low signal of zero (0) to the microprocessor port to turn the high side driver output off in step 70. In order to check for an open fault condition, routine 30 waits for a time delay of about 300 microseconds after the high side driver output is turned off in step 72. The time delay of 300 microseconds allows for an electrical discharge through capacitor C1 of the discrete driver circuitry. In step 74, routine 30 configures the microprocessor port as an input and then, in step 76, reads the input feedback signal received at the microprocessor port. In decision step 78, routine 30 determines if the input feedback signal read at the microprocessor port is equal to zero (0) or one (1). If the input feedback signal is equal to zero, routine 30 determines in step 80 that there are no fault conditions detected and that the discrete driver circuitry and load are in a normal operation, before returning in step 86. If the input feedback signal read at the microprocessor port is equal to one, routine 30 determines in step 82 that an open circuit fault condition is detected, and then reports the open circuit fault condition and disables the output driver in step 84.

Accordingly, the routine 30 advantageously allows for the outputting of drive signals to drive a load via the discrete driver circuitry when the microprocessor port is configured as an output. By reconfiguring the microprocessor port as an input and an output, the microprocessor is able to receive feedback signals and to detect the presence of fault conditions, including a short to battery fault, a short to ground fault, and an open circuit fault. The logic 30 thereby enables the microprocessor 12 and discrete driver circuitry 20 to operate the microprocessor port to drive a given load and detect fault conditions. This advantageously results in a reliable controller that is affordable, uses reduced part components.

While routine 30 is shown and described herein driving one load and detecting fault conditions via discrete driver circuitry coupled to one microprocessor port, it should be appreciated that plural loads may be driven by plural driver circuits coupled to other microprocessor ports. Further, while the discrete driver circuitry 20 is shown and described herein according to one application for driving a load 16A, it should be appreciated that other discrete driver circuits may be employed without departing from the spirit of the present invention.

Figure 3:
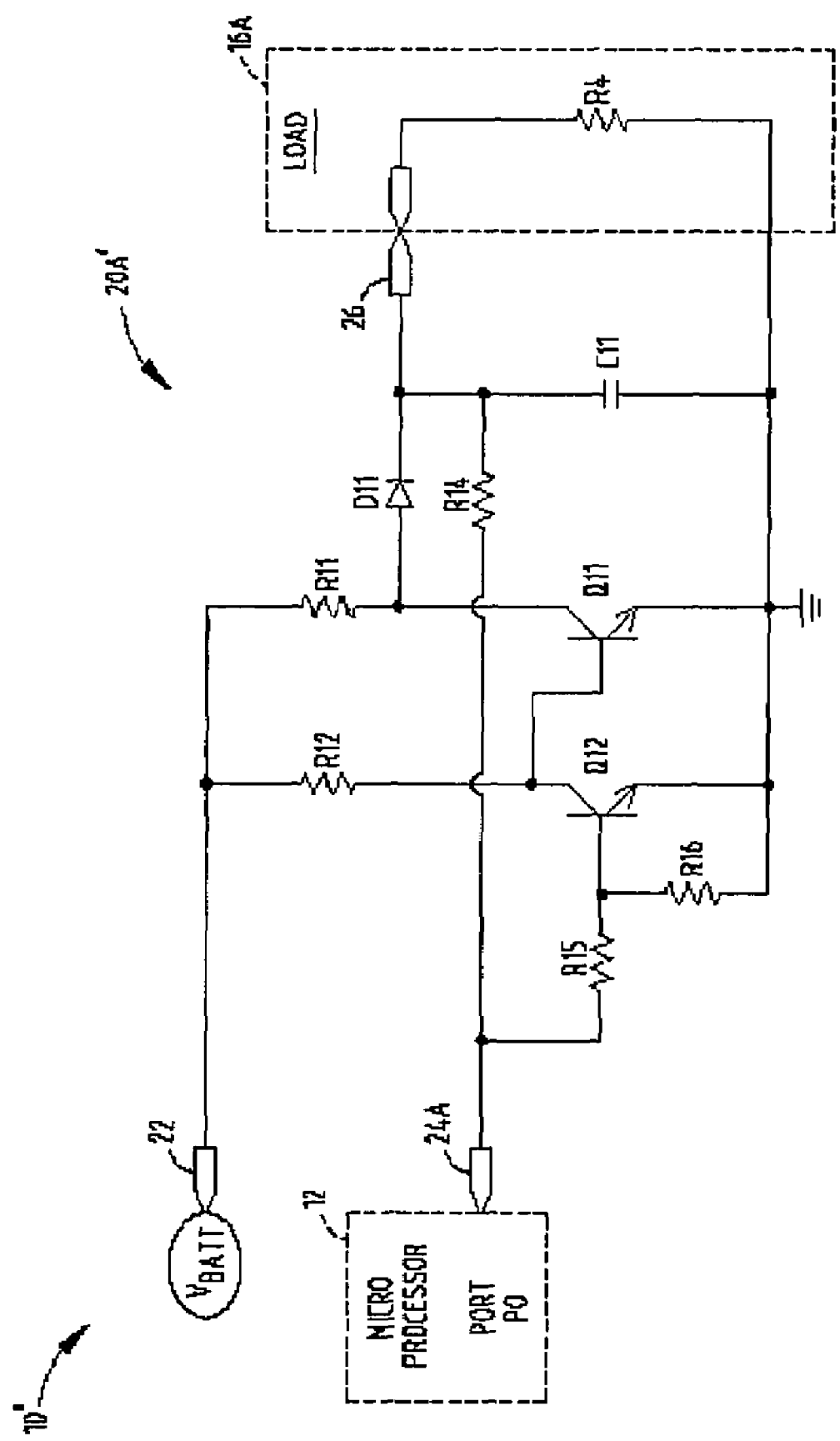
FIG. 3 is a block/circuit diagram illustrating discrete driver circuitry according to a second embodiment of the present invention.

Referring to FIG. 3, a controller 10' employing a discrete driver circuitry 20A' is illustrated according to another embodiment. In this embodiment, the discrete driver circuitry 20A' includes an input 24A connected to a single port P0 of microprocessor 12. Discrete driver circuitry 20A' receives a battery voltage $V_{BATT}$ via power input 22 and drives a load 16A shown having a resistance R4. In contrast to the discrete driver circuitry 20A of the first embodiment, the discrete driver circuitry 20A' employs an alternative circuit arrangement having resistors R11, R12, R14, R15 and R16, capacitor C11, transistors Q11 and Q12, and diode D11. Transistor Q11 and Q12 are inverted such that when transistor Q11 is on, transistor Q12 is off. A high signal output from microprocessor port P0 causes electrical current to be applied to load 16A. The controller 10' may be operatively controlled by logic similar to that described above.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. A controller for driving an electrical load, said controller comprising:

a processor comprising at least one port configurable to operate as an input or an output;

discrete driver circuitry connected to said one port of the processor, said discrete driver circuitry configured to selectively apply electrical power to drive an electrical load or remove electrical power from said load in response to a drive signal; and logic for configuring the one port of the processor as an output to provide the drive signal to the discrete driver circuitry, and further for configuring the one port of the processor as an input to receive a feedback signal from the discrete driver circuitry;

said logic and said discrete driver circuitry interoperable to distinctly detect, identify, and report a short to ground fault condition;

said logic and said discrete driver circuitry further interoperable to distinctly detect, identify, and report a short to power fault condition;

said logic and said discrete driver circuitry further interoperable to distinctly detect, identify, and report an open circuit fault condition, wherein the discrete driver circuitry comprises a capacitor coupled in parallel with both the electrical load and with a resistance distinct from the electrical load, and wherein the open circuit fault condition is detected based on a discharge rate of the capacitor when the drive signal is controlled to a state whereby electrical power is removed from the electrical load.

2. The controller as defined in claim 1, wherein the processor comprises a microprocessor.

3. The controller as defined in claim 1, wherein the processor comprises a plurality of ports and the controller comprises a plurality of discrete driver circuits, wherein each of the plurality of discrete driver circuits is connected to a respective one of the plurality of ports for driving respective electrical loads in the output mode of the ports and for receiving feedback signals in the input mode of the ports.

4. The controller as defined in claim 1, wherein the logic performs a fault detection routine to detect a fault condition based on the feedback signal.

5. The controller as defined in claim 1, wherein the controller is employed on board a vehicle to drive a load on the vehicle.

6. The controller as defined in claim 1, wherein the logic is software stored in memory and executed by the processor.

7. A method of driving an electrical load and detecting a fault condition with discrete driver circuitry and a processor, said method comprising the steps of:

providing an electrical load coupled to discrete driver circuitry which is coupled to a single port of a processor;

configuring the single port of the processor to operate as an output;

outputting a signal at the single port of the processor signaling for an electrical load to be driven;

applying power to the electrical load responsive to the output signal;

configuring the single port of the processor to operate as an input;

receiving a feedback signal from the discrete driver circuitry at the port of the processor;

detecting presence of a short to ground fault condition in the event of a short to ground fault condition based on the feedback signal;

detecting presence of a short to battery fault condition in the event of a short to battery fault condition based on the feedback signal;

detecting presence of an open circuit fault condition in the event of an open circuit fault condition based on the feedback signal by detecting a discharge rate across a capacitor coupled in parallel with both the electrical load and with a resistance distinct from the electrical load and detecting the open circuit fault condition based on the discharge rate when power is removed from the electrical load; and reporting the detected fault condition.

8. The method as defined in claim 7 further comprising the steps of driving a plurality of loads with a plurality of discrete driver circuits, wherein each of the plurality of driver circuits is connected to a respective port of the processor.

9. The method as defined in claim 7, wherein the processor is a microprocessor.

10. The method as defined in claim 7 further comprising the step of reconfiguring the single port of the processor to operate as an output following receipt of the feedback signal.

11. The method as defined in claim 7, wherein the steps are performed by software executed by the processor.

12. The method as defined in claim 7, wherein the electrical load is located on board a vehicle.

* * * * *